United States Patent [19]

Hayafuji

[11] Patent Number: 5,100,480

[45] Date of Patent: Mar. 31, 1992

[54] SOLAR CELL AND METHOD FOR MANUFACTURING THE SAME

[75] Inventor: Norio Hayafuji, Itami, Japan

[73] Assignee: Mitsubishi Denki Kabushiki Kaisha, Japan

[21] Appl. No.: 606,853

[22] Filed: Oct. 31, 1990

[30] Foreign Application Priority Data

Apr. 18, 1990 [JP] Japan .................................. 2-102633

[51] Int. Cl.$^5$ ...................... H01L 31/05; H01L 31/18
[52] U.S. Cl. .................................. 136/249; 136/251; 136/256; 136/262; 437/2; 437/5
[58] Field of Search ................ 136/249 MS, 256, 262, 136/251; 437/2-5, 205

[56] References Cited

U.S. PATENT DOCUMENTS

| | | | |
|---|---|---|---|
| 4,110,122 | 8/1978 | Kaplow et al. | 136/249 MS |
| 4,156,309 | 5/1979 | Routh et al. | 437/2 |
| 4,200,472 | 4/1980 | Chappell et al. | 136/246 |
| 4,219,368 | 8/1980 | David | 136/249 MS |
| 4,278,473 | 7/1981 | Borden | 136/249 MS |
| 4,335,503 | 6/1982 | Evans, Jr. et al. | 437/2 |
| 4,897,123 | 1/1990 | Mitsui | 136/256 |

FOREIGN PATENT DOCUMENTS

| | | | |
|---|---|---|---|
| 58-201376 | 11/1983 | Japan | 136/244 |
| 63-211773 | 9/1988 | Japan | 136/256 |
| 1-82570 | 3/1989 | Japan | 136/256 |
| 1-82571 | 4/1989 | Japan | 136/256 |
| 1010476 | 1/1965 | United Kingdom | 136/249 MS |

OTHER PUBLICATIONS

Arnold et al., "GaAs Interconnect . . . Technology", IEEE Photovoltaic Specialists Conference, Oct. 1985, pp. 663-668.

*Primary Examiner*—Aaron Weisstuch
*Attorney, Agent, or Firm*—Leydig, Voit & Mayer

[57] ABSTRACT

A solar cell includes an insulating or semi-insulating substrate having a pair of through holes, an n type semiconductor layer disposed on the front surface of the substrate, and a p type semiconductor layer disposed on the substrate in the first hole and on the n type semiconductor layer. An n side electrode is formed on the surface of the n type semiconductor layer in the second hole and also on a part of the back surface of the substrate. A p side electrode is formed on the surface of the p type semiconductor layer in the first hole and also on the back surface of the substrate. In connecting a plurality of solar cells in a wafer in series, a trench reaching the substrate is formed between adjacent solar cells.

6 Claims, 3 Drawing Sheets

SOLAR CELL AND METHOD FOR MANUFACTURING THE SAME

FIELD OF THE INVENTION

The present invention relates to a solar cell, to a method of manufacturing a solar cell, to a method of interconnecting a plurality of solar cells, and to the solar cell structure produced thereby.

BACKGROUND OF THE INVENTION

FIG. 3 is a sectional view showing a solar cell module formed by connecting a plurality of conventional solar cells which is disclosed in "GaAs Interconnect Design And Weld Technology", *IEEE PVSC*-1985, page 633. In FIG. 3, a solar cell comprises an n-type GaAs layer 2 and a p-type GaAs layer 3 disposed on an n-type GaAs substrate 1 and a cover glass attached thereto with a first adhesive 4. To interconnect these solar cells, an upper electrode of a first solar cell is connected to a lower electrode of a second solar cell with an interconnector 6. An upper electrode of the second solar cell is connected to a lower electrode of a third solar cell, and so forth. In this way, the upper electrode on one solar cell is connected to the lower electrode of the adjacent solar cell by the interconnector 6, whereby a predetermined number of solar cells are connected in series. These connected solar cells are arranged and mounted on a honeycomb board 8 with a second adhesive 7, completing the solar cell module.

Since the conventional solar cell is constructed as described above, when a solar cell is formed by connecting a plurality of solar cells in series, the solar cells are separate and the degree of freedom in designing the layout is low. In addition, since the p side electrode and the n side electrode are formed on the upper and lower surfaces of the solar cell, respectively, it is necessary to connect the upper electrode of one solar cell to the lower electrode of the adjacent solar cell to make a seris connection. However, it is difficult to connect two electrodes with the interconnector 6 because there is a large difference in the positions of the planes of the interconnection locations due to the thickness of the solar cells. The resulting structure with the interconnector 6 is complicated.

In addition, physical stress, such as heat generated at the time of interconnecting the solar cells, is applied to the solar cell, resulting in degradation of electrical characteristics of the solar cell.

Solar cells that avoid the difference in planes of interconnection and simplify the connection of solar cells are disclosed in Japanese Published Patent applications 64-82570, 64-82571, and 63-211773. In the structure disclosed in those publications, a through hole is formed in a substrate and an electrode on a front surface of the substrate reaches the rear surface of the substrate through the substrate and is connected to an electrode on the rear surface of the substrate. In this case, however, it is necessary to cover the pn junction with an insulating film to pass the electrode on the front surface of the substrate to the rear surface. The formation of that insulating film is difficult. Furthermore, it is technically difficult to pass the electrode on the front surface of the substrate to the rear surface thereof.

SUMMARY OF THE INVENTION

The present invention was made to solve these problems and it is an object of the present invention to provide a solar cell and a method of manufacturing in which a plurality of solar cells on one wafer are connected, the wiring structure and the solar cell interconnection procedures are simple, a large physical stress is not applied at the time of interconnecting the solar cells, and electrical characteristics of the solar cells are not degraded by the interconnection process.

Other objects and advantages of the present invention will become apparent from the detailed description given hereinafter. It should be understood, however, that the detailed description and specific embodiment are provided for illustration only, since various additions and modifications within the spirit and scope of the invention will become apparent to those of skill in the art from the detailed description.

According to a solar cell of the present invention, a semiconductor layer including a pn junction serving as an active layer of the solar cell is formed on an insulating or semi-insulating substrate, part of each of the electrodes formed on the p-type and the n-type semiconductor layers, respectively, is exposed on the rear surface of the substrate, and the adjacent solar cells are connected through these exposed electrodes at the rear surface of the substrate.

According to the present invention, a plurality of solar cells can be formed in one wafer, there is no difference in planes in which adjacent solar cells are interconnected in series, the wiring structure is simple, and the interconnection process is easy. Further, the physical stress applied to the solar cell during the interconnection process is reduced.

DETAILED DESCRIPTION OF PREFERRED EMBODIMENT

Figure 1:
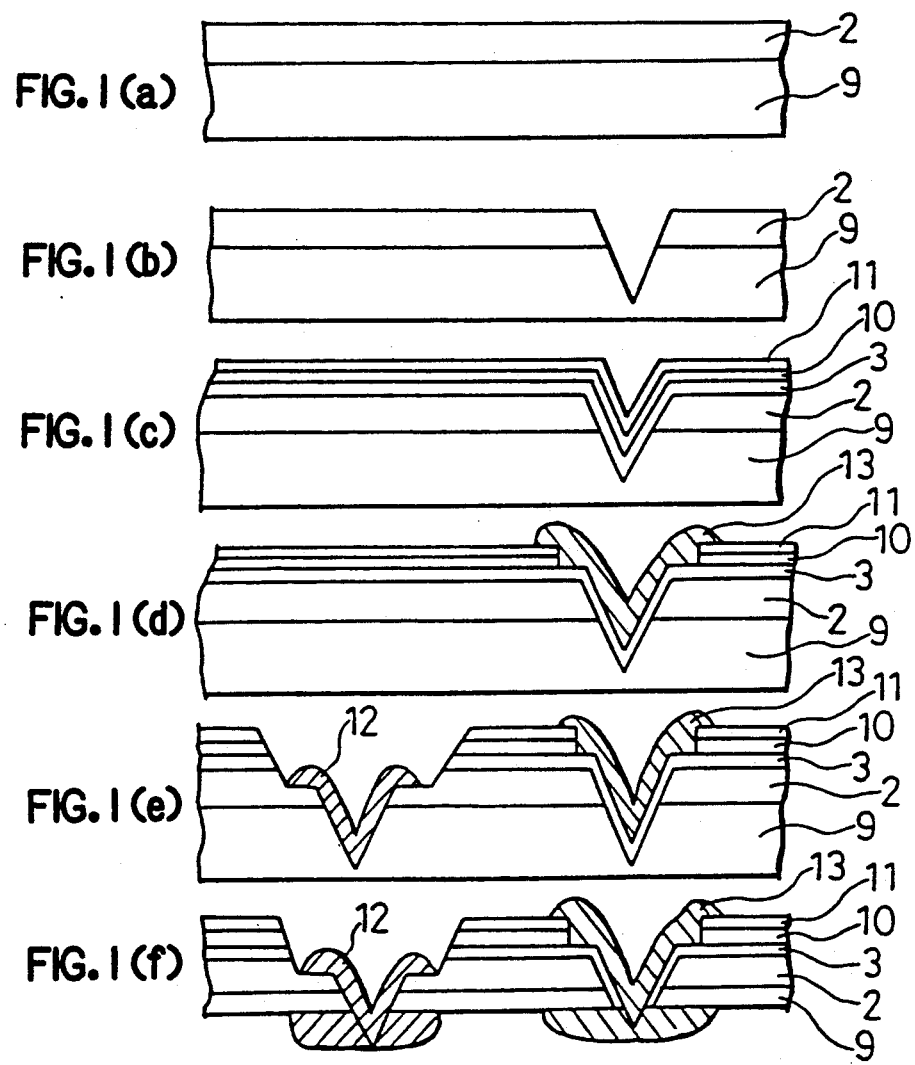
FIGS. 1(*a*)–1(*f*) are sectional views showing steps in manufacturing a GaAs solar cell in accordance with an embodiment of the present invention.
Figure 3:
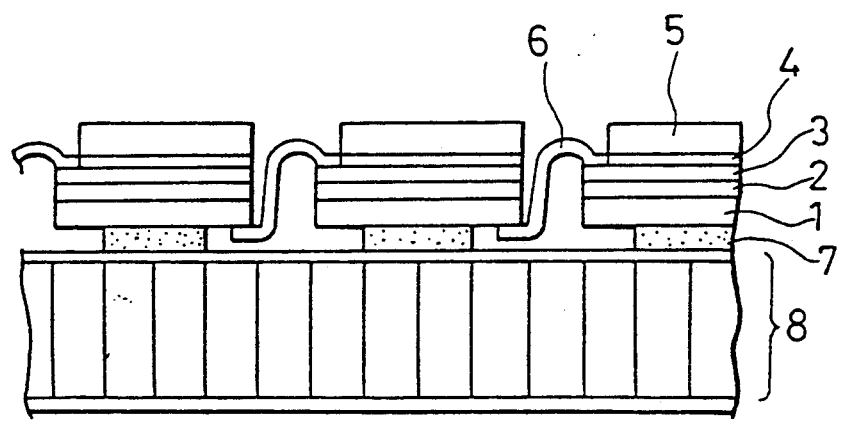
FIG. 3 is a sectional view showing the structure of a conventional solar cell module comprising a plurality of solar cells.

FIGS. 1(*a*)–1(*f*) are sectional views of a GaAs solar cell in several manufacturing steps. The same reference numerals as in FIG. 3 designate the same or corresponding parts.

An n-type GaAs layer 2 is grown on a semi-insulating GaAs substrate 9 by the metal organic chemical vapor deposition method (MOCVD method) (FIG. 1(*a*)) and then a part of the n-type GaAs layer 2 and the semi-insulating GaAs substrate 9 is selectively etched to form a groove (FIG. 1(*b*)).

A p-type GaAs layer 3 and p-type AlGaAs window layer 10 for preventing surface recombination are grown thereon by the MOCVD method and the a reflection preventing film of $Si_3N_4$ is deposited by a photo assisted CVD method (FIG. 1(*c*)).

The p-type GaAs layer 3 is exposed by selectively etching the layers 10 and 11 to form a groove and then a p side electrode 13 is formed thereon (FIG. 1(*d*)).

Another part of the n-type GaAs layer 2 and the semi-insulating GaAs substrate 9 is selectively etched to form another groove and then an n side electrode 12 is formed therein (FIG. 1(*e*)).

Finally, the rear surface of the semi-insulating GaAs substrate 9 is etched or ground so that a part of each of the n side electrode 12 and the p side electrode 12 is exposed. The electrodes are then reinforced by plating or the like (FIG. 1(f)).

Figure 2:
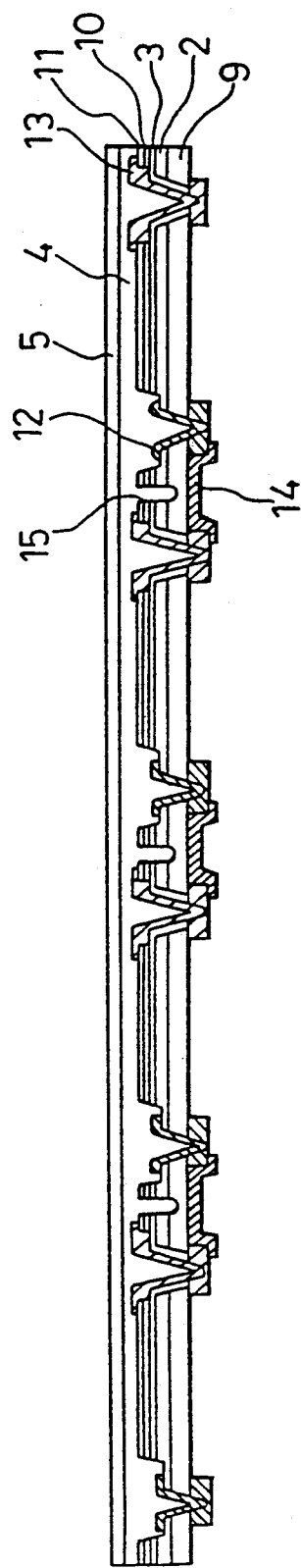
FIG. 2 is a sectional view showing an example of a plurality of solar cells integrated on one wafer according to an embodiment of the invention.

FIG. 2 is a sectional view showing an example of GaAs solar cells manufactured in accordance with the method shown in FIGS. 1(a)–1(f) integrated on a wafer. In FIG. 2, reference numeral 14 designates a wiring metallization connecting the p side electrode 13 to the n side electrode 12. Reference numeral 15 designates a groove extending into the semi-insulating GaAs substrate 9 to prevent electrical short-circuiting between adjacent solar cells.

As can be seen from FIG. 2, the wiring metallization connects the n side electrode 12 of one solar cell on the rear surface of the substrate to the p side electrode 13 of the adjacent solar cell on the rear surface of the substrate.

As described above, in this embodiment, the pn junction is insulated by the semi-insulating GaAs substrate 9. The first and second conductivity type electrodes are disposed in grooves in the solar cell active regions. When a plurality of solar cells are connected in series, electrodes exposed on the rear surface of the substrate 9 are sequentially connected to the electrodes of respective adjacent solar cells. Finally, the groove 15 is formed between the adjacent solar cells, extending to the semi-insulating GaAs substrate 9. As a result, a plurality of solar cells can be formed on one wafer by a simple fabrication technique. When connecting the plurality of solar cells to make a solar cell module, there is no difference in positions of the planes of the connecting part and the wiring structure and the connecting procedure is simple and easy. Furthermore, physical stress at the time of the connecting procedure is reduced.

Although semi-insulating GaAs is used as the substrate for the solar cell in the above embodiment, the substrate is not limited to this material and another insulating material, such as sapphire, InP, or a semi-insulating material other than GaAs can be used.

In addition, although GaAs and AlGaAs are used as materials in the active region of the solar cell in the above embodiment, other materials, such as InP, GaAsP, or InGaAsP, can be used.

As described above, in a method of manufacturing the solar cell according to the present invention, a semiconductor layer which has a pn junction serving as a solar cell active layer is formed on an insulating or semi-insulating substrate, a part of each of the electrodes formed on the p-type and n-type semiconductor layers is exposed on the rear surface of the substrate, and adjacent solar cells are serially connected using these exposed electrodes. As a result, the solar cell can be made in a simple manufacturing process and a solar cell module can be formed in a simple manner by connecting in series a plurality of solar cells formed on a wafer. In addition, the connecting procedure is simple and physical stress, such as caused by heat, is reduced and electrical characteristics are not degraded.

Although the present invention has been described and illustrated in detail, it is clearly understood that the same is by way of illustration only and is not to be taken by way of limitation, the spirit and scope of the present invention being limited only by the terms of the appended claims.

What is claimed is:

1. A solar cell device including a plurality of solar cells, each comprising:
   an insulating or semi-insulating substrate having opposed front and rear surfaces and first and second holes penetrating through said substrate from the front surface to the rear surface;
   a first conductivity type semiconductor layer disposed on the front surface of said substrate;
   a second conductivity type semiconductor layer disposed on said first conductivity type semiconductor layer opposite the front surface of said substrate and in the first hole and on said substrate in the first hole;
   a first electrode disposed on said first conductivity type semiconductor layer in said second hole and extending to and disposed on a part of the rear surface of said substrate; and
   a second electrode disposed on said second conductivity type semiconductor layer in the first hole and extending to and disposed on a part of the rear surface of said substrate.

2. A solar cell device in accordance with claim 1, wherein said plurality of solar cells are formed in a single semiconductor wafer, said first electrode on the rear surface of said substrate of one solar cell is electrically connected to a second electrode of an adjacent solar cell on the rear surface of said substrate and including a groove extending through said first and second conductivity type semiconductor layers and into said substrate at the front surface between the adjacent electrically connected solar cells.

3. A solar cell device in accordance with claim 2, wherein an adhesive is disposed on a light incident surface of the device and a cover glass is adhered to the device with said adhesive.

4. A solar cell device in accordance with claim 1, wherein said substrate is semi-insulating GaAs and said first and second conductivity type semiconductor layers are n type and p type GaAs layers, respectively.

5. A method of manufacturing a solar cell device, comprising the steps of:
   forming a first conductivity type semiconductor layer on a front surface of an insulating or semi-insulating substrate;
   forming a plurality of spaced apart first grooves extending through said first conductivity type semiconductor layer and into said substrate by selectively etching said first conductivity type semiconductor layer and said substrate;
   forming a second conductivity type semiconductor layer on said first conductivity type semiconductor layer opposite the front surface of said substrate and in the first grooves and on said substrate in the first grooves;
   forming respective first electrodes on said second conductivity type semiconductor layer in the first grooves;
   forming a plurality of spaced apart second grooves respectively spaced from the first grooves and extending through said first and second conductivity type semiconductor layers and into said substrate by selectively etching said first and second conductivity type semiconductor layers and said substrate;
   forming respective second electrodes on said substrate and said first conductivity type semiconductor layer in the second grooves;

exposing said first and second electrodes at the rear surface of said substrate by removing part of said substrate;

electrically connecting said first electrodes to respective second electrodes of adjacent solar cells on the rear surface of said substrate; and forming respective spaced apart third grooves extending through the first and second conductivity type semiconductor layers and into said substrate between adjacent electrically connected solar cells.

6. A method of manufacturing a solar cell device in accordance with claim 5, comprising disposing an adhesive on the front surface of the partially completed device and adhering a cover glass to the front surface with the adhesive.

* * * * *